United States Patent
Lee et al.

(10) Patent No.: US 9,721,827 B2
(45) Date of Patent: Aug. 1, 2017

(54) SEMICONDUCTOR ARRANGEMENT WITH STRESS CONTROL AND METHOD OF MAKING

(71) Applicant: Taiwan Semiconductor Manufacturing Company Limited, Hsin-Chu (TW)

(72) Inventors: Wei-Fan Lee, Hsinchu (TW); Yuan-feng Chao, Hsinchu (TW); Yen Chuang, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/191,493

(22) Filed: Feb. 27, 2014

(65) Prior Publication Data

US 2015/0243785 A1    Aug. 27, 2015

(51) Int. Cl.
*H01L 29/78* (2006.01)
*H01L 21/762* (2006.01)
*H01L 29/66* (2006.01)
*H01L 29/08* (2006.01)
*H01L 29/10* (2006.01)
*H01L 29/165* (2006.01)

(52) U.S. Cl.
CPC ........ *H01L 21/762* (2013.01); *H01L 29/0847* (2013.01); *H01L 29/1054* (2013.01); *H01L 29/66628* (2013.01); *H01L 29/66636* (2013.01); *H01L 29/7848* (2013.01); *H01L 29/165* (2013.01); *H01L 29/66659* (2013.01)

(58) Field of Classification Search
CPC ...................... H01L 29/1054; H01L 29/66636

USPC .................................................. 257/327, 401
See application file for complete search history.

(56) References Cited

U.S. PATENT DOCUMENTS

| | | | | |
|---|---|---|---|---|
| 2004/0026765 A1* | 2/2004 | Currie | ............ | H01L 21/823807 257/616 |
| 2011/0303951 A1* | 12/2011 | Zhu | ....................... | H01L 29/045 257/192 |
| 2012/0043624 A1* | 2/2012 | Liang | ................ | H01L 21/28123 257/410 |
| 2012/0261718 A1* | 10/2012 | Sosa Cortes | ...... | H01L 29/41783 257/192 |
| 2012/0319166 A1* | 12/2012 | Adam et al. | .................. | 257/192 |
| 2013/0264653 A1* | 10/2013 | Cai | ......................... | H01L 29/16 257/369 |

(Continued)

*Primary Examiner* — Jerome Jackson, Jr.
*Assistant Examiner* — David Spalla
(74) *Attorney, Agent, or Firm* — Cooper Legal Group, LLC

(57) ABSTRACT

One or more semiconductor arrangements are provided. The semiconductor arrangements include a buried layer over a well, a dielectric layer over the buried layer, a first gate stack over the dielectric layer and a S/D region disposed proximate the first gate stack. The S/D region has a first tip proximity region that extends under the first gate stack. One or more methods of forming a semiconductor arrangement are also provided. The methods include forming a S/D recess in at least one of a dielectric layer, a buried layer or a well, wherein the S/D recess is proximate a first gate stack and has a first recess tip proximity region that extends under the first gate stack as a function of the buried layer, and forming a S/D region in the S/D recess such that the S/D region has a first tip proximity region that extends under the first gate stack.

20 Claims, 13 Drawing Sheets

(56) References Cited

U.S. PATENT DOCUMENTS

| | | | |
|---|---|---|---|
| 2013/0337651 A1* | 12/2013 | Ko | H01L 21/31144 438/702 |
| 2014/0038382 A1* | 2/2014 | Basker | H01L 21/0243 438/390 |
| 2014/0087537 A1* | 3/2014 | Kim | H01L 29/66477 438/301 |
| 2014/0117456 A1* | 5/2014 | Huang et al. | 257/368 |
| 2014/0322879 A1* | 10/2014 | Li | H01L 21/30608 438/285 |
| 2015/0137193 A1* | 5/2015 | Cheng | H01L 29/7842 257/288 |
| 2015/0200253 A1* | 7/2015 | Chen | H01L 29/1054 257/77 |
| 2015/0228735 A1* | 8/2015 | Zhong | H01L 29/66825 257/190 |

\* cited by examiner

SEMICONDUCTOR ARRANGEMENT WITH STRESS CONTROL AND METHOD OF MAKING

BACKGROUND

A transistor comprises a source region, a drain region, and a channel region between the source region and the drain region. The transistor comprises a gate stack that controls the channel region to operate the transistor. The gate stack is formed around one or more surfaces of the channel region, which provides the gate region with increased control over the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
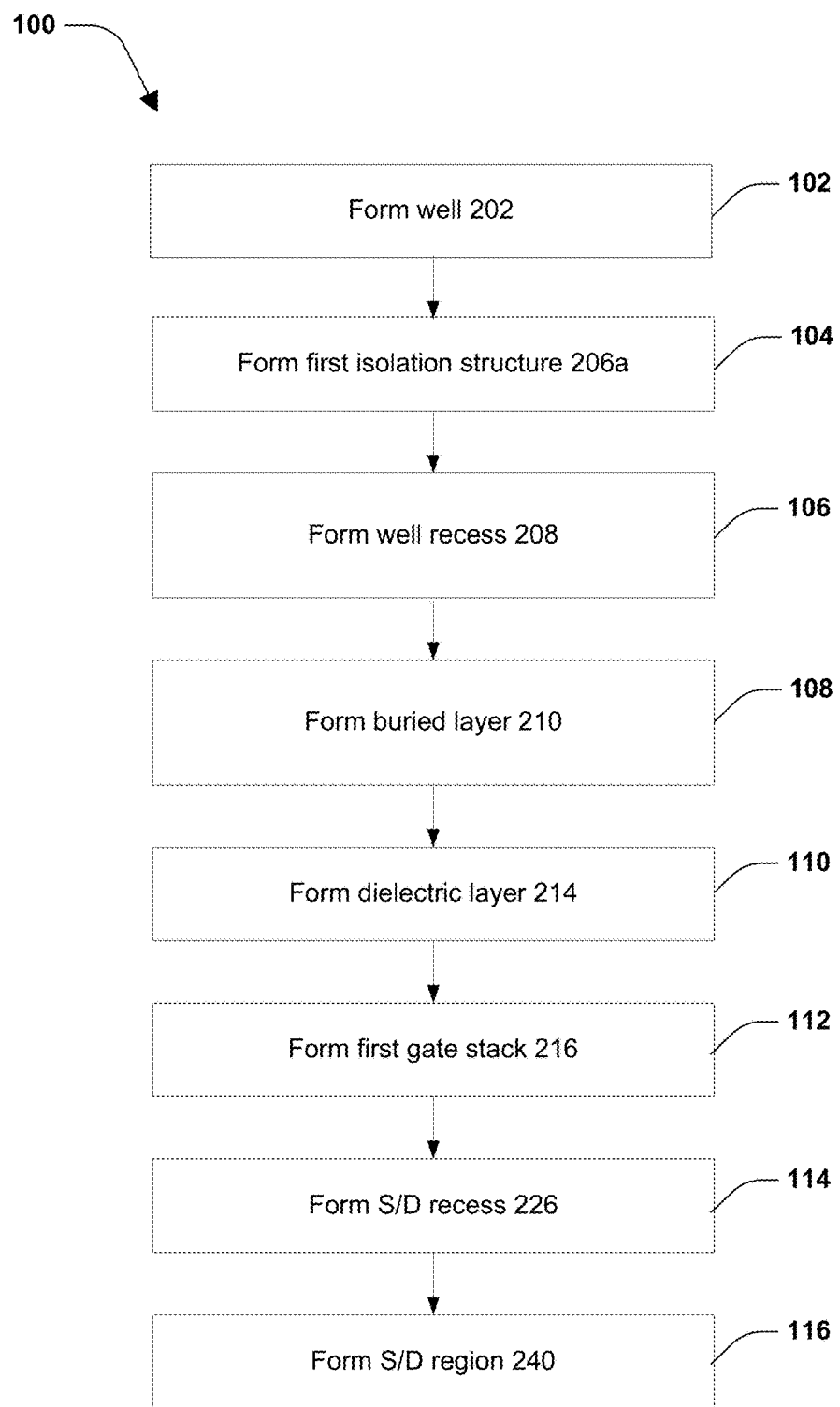
FIG. 1 is a flow diagram illustrating a method for fabricating a semiconductor arrangement, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and one or more methods for forming such semiconductor arrangements are provided herein. In some embodiments, a semiconductor arrangement includes a multi-gate transistors or fin-type multi-gate transistors. In some embodiments, the semiconductor arrangement includes a buried layer. In some embodiments, the buried layer affects at least one of the size or shape of a source/drain (S/D) region. In some embodiments, the buried layer functions to cause the S/D region to extend under a gate stack and into a channel region. In some embodiments, the shape of the S/D region alters at least one of a stress or a strain applied to the channel region. In some embodiments, a higher compressive strain on the channel region results in a higher hole mobility. In some embodiments, the higher hole mobility enhances electron mobility and alters the performance of the semiconductor arrangement.

Referring to FIG. 1, illustrated is a flow diagram of a method 100 for fabricating a semiconductor arrangement 200 according to some embodiments. Referring also to FIGS. 2 to 9, illustrated are cross-sectional views of the semiconductor arrangement 200 at various stages of fabrication according to some embodiments, such as according to the method 100 of FIG. 1. In some embodiments, part of the semiconductor arrangement 200 is fabricated with a CMOS process flow. In some embodiments, additional processes are provided before, during, and after the method 100 of FIG. 1

Figure 2:
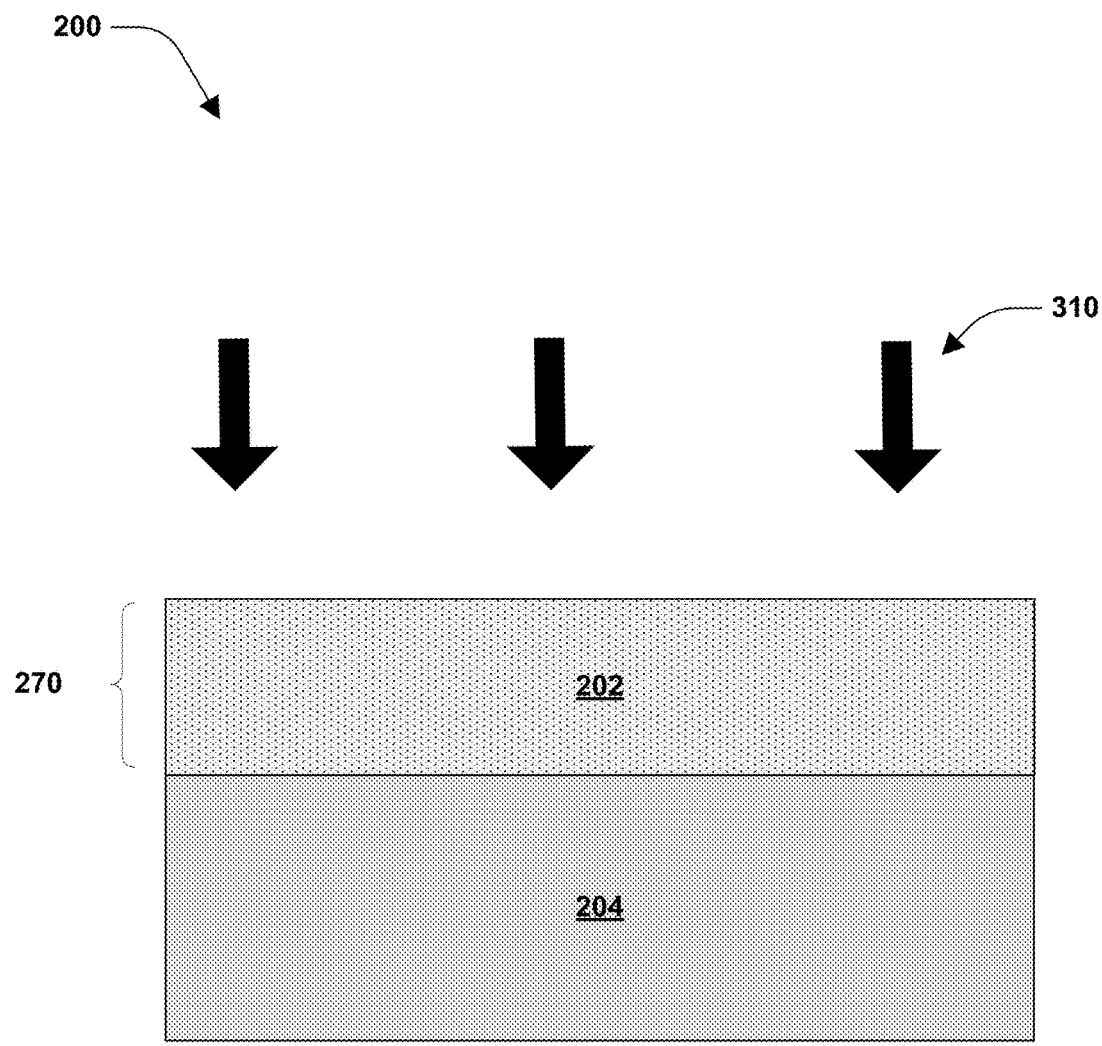
FIG. 2 is a cross-sectional view of a semiconductor arrangement during fabrication, according to some embodiments.

At 102, a well 202 is formed, as illustrated in FIG. 2. In some embodiments, the well 202 is formed in a substrate 204. In some embodiments, the substrate 204 is a silicon substrate. In some embodiments, the substrate 204 includes at least one of silicon germanium, silicon carbide, gallium arsenic, gallium phosphide, indium phosphide, indium arsenide, indium antimonide or other suitable semiconductor material. According to some embodiments, the substrate 202 comprises at least one of an epitaxial layer, a silicon-on-insulator (SOI) structure, a wafer, or a die formed from a wafer. In some embodiments, the well 202 is formed by a first process 310. In some embodiments, the first process 310 includes implanting a dopant. In some embodiments, the dopant is at least one of n-type or a p-type dopant. In some embodiments, the n-type dopant includes at least one of arsenic or phosphorous. In some embodiments, the p-type dopant includes boron. In some embodiments, the first process 310 includes a thermal process for dopant drive-in diffusion. In some embodiments, the well 202 is at least one of a P-well or a N-well.

Figure 3:
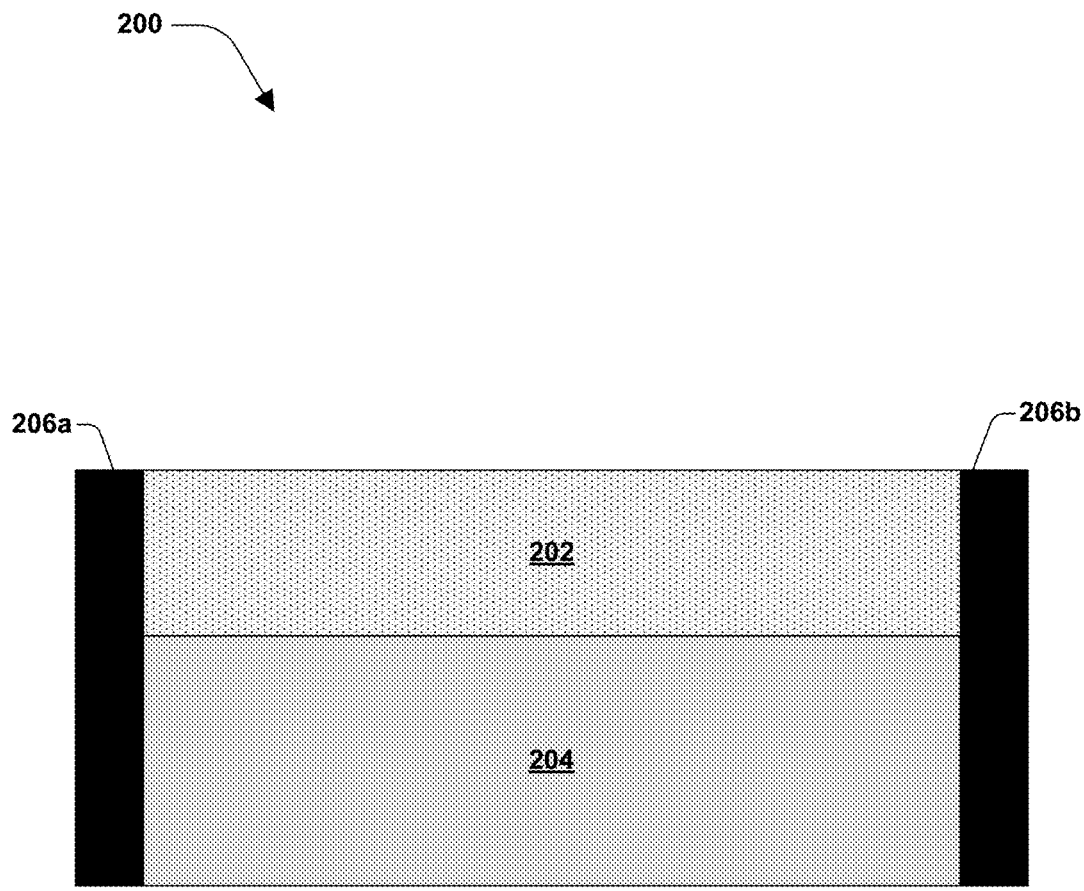
FIG. 3 is a cross-sectional view of a semiconductor arrangement during fabrication, according to some embodiments.

At 104, at least one of isolation structures 206a-206b is formed, as illustrated in FIG. 3. In some embodiments, at least one of the isolation structures 206a-206b is disposed proximate at least one of the substrate 202 or the well 204. In some embodiments, at least one of the isolation structure 206a-206b is a shallow trench isolation (STI) structure. In some embodiments, at least one of the isolation structures 206a-206b isolates an active region of the semiconductor arrangement 200. In some embodiments, the active region is configured as at least one of a NMOS device or a PMOS device. In some embodiments, the isolation structure 212 isolates the active region of a NMOS device from the active region of an adjacent device, such as a PMOS device. In some embodiments, at least one of the isolation structures 206a-206b includes at least one of silicon oxide, silicon nitride, silicon oxynitride, fluoride-doped silicate glass (FSG) or a low-k dielectric material.

Figure 4:
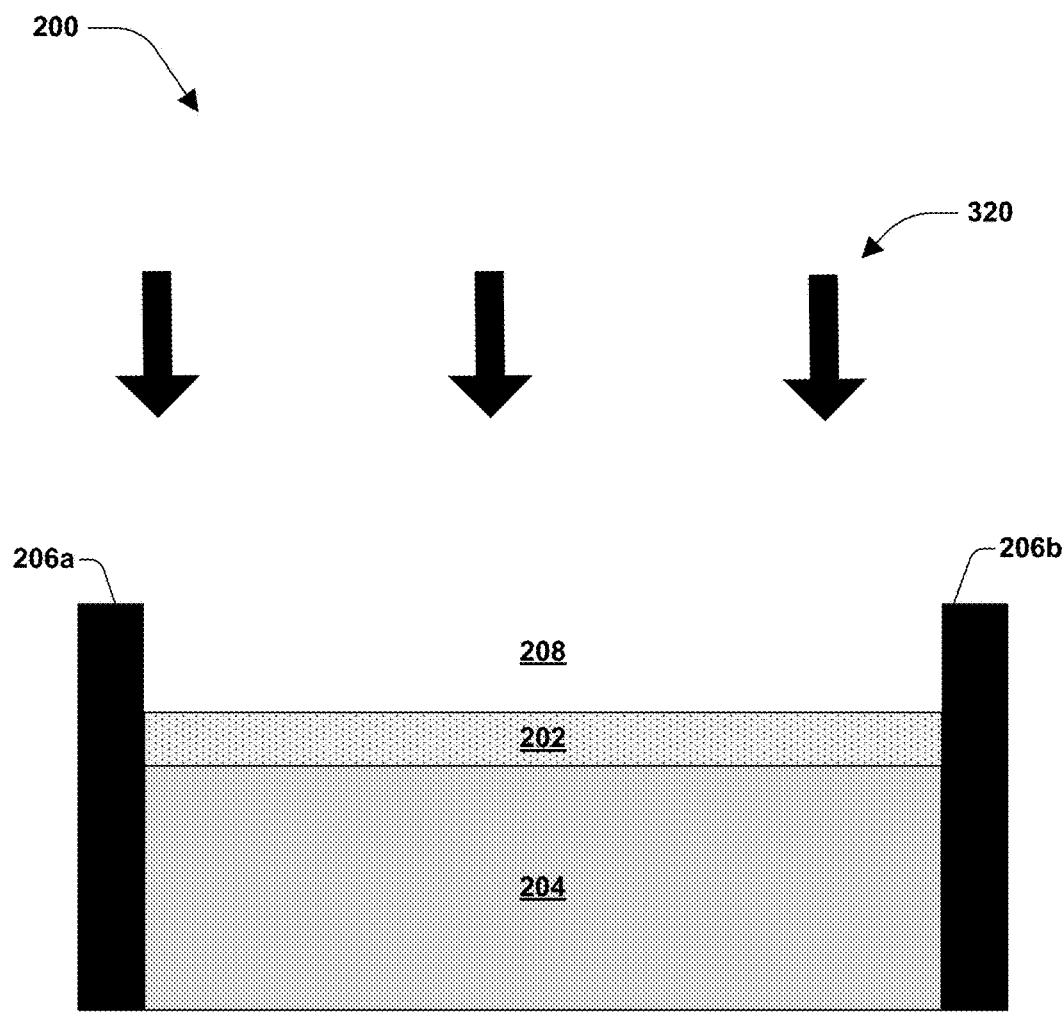
FIG. 4 is a cross-sectional view of a semiconductor arrangement during fabrication, according to some embodiments.

At 106, a well recess 208 is formed, as illustrated in FIG. 4 In some embodiments, the well recess 208 is formed in the well 202. In some embodiments, the well recess 208 is proximate the isolation structure 206. In some embodiments, the well recess 208 is formed by a second process 320. In some embodiments, the second process 320 includes an etching process. In some embodiments, the etching process is preformed over a masking element and an exposed surface of the well 202. In some embodiments, the second process 320 includes at least one of a wet etch or a dry etch. In some embodiments, at least one of the wet etch or the dry etch includes the use of at least one of hydrogen fluoride (HF), sodium hydroxide (NaOH), chlorine (Cl), tetrafluoromethan ($CF_4$), sulfur hexafluoride ($SF_6$), or nitrogen trifluoride ($NF_3$).

Figure 5:
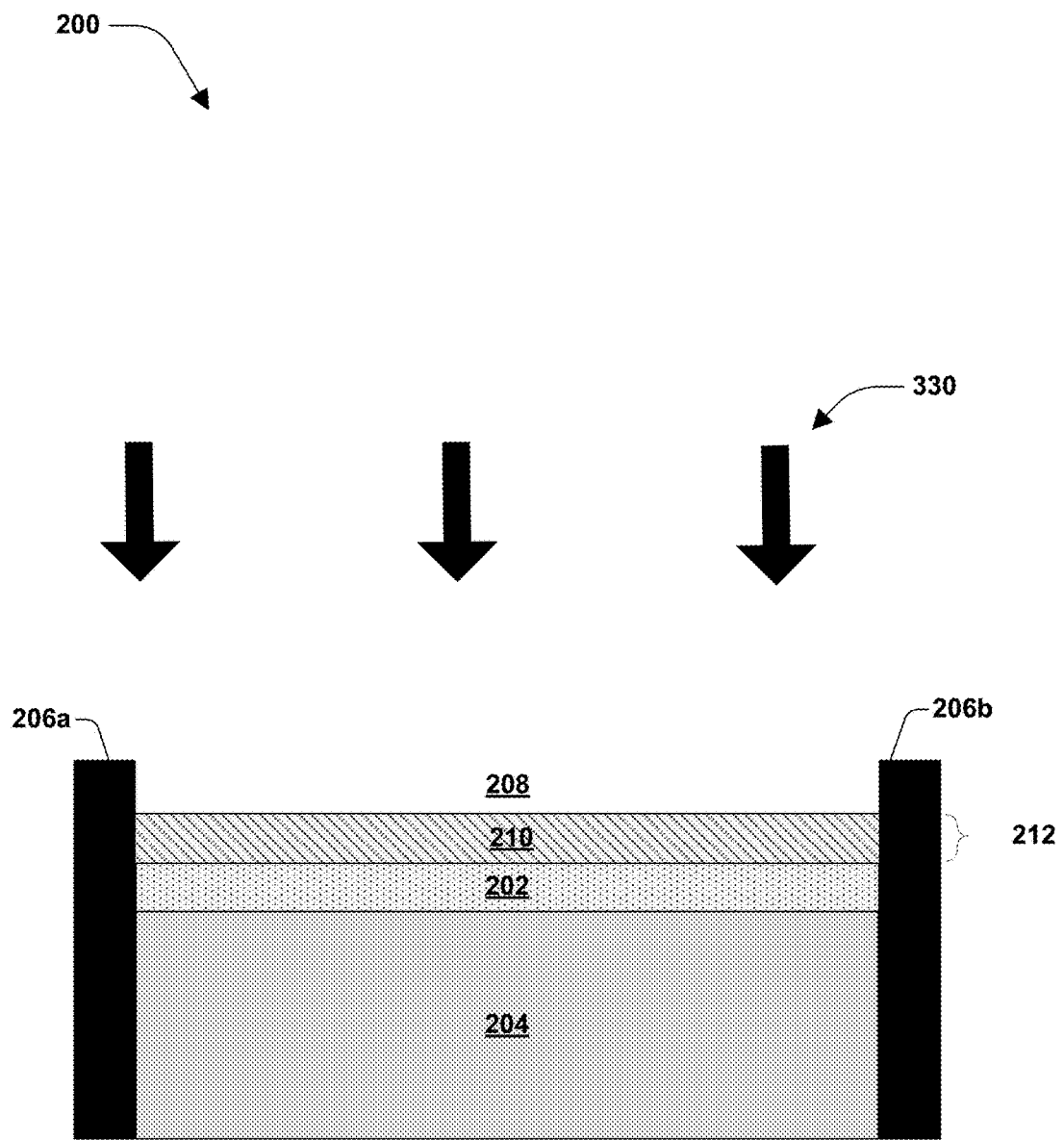
FIG. 5 is a cross-sectional view of a semiconductor arrangement during fabrication, according to some embodiments.

At 108, a buried layer 210 is formed, as illustrated in FIG. 5. In some embodiments, the buried layer 210 is formed over the well 202. In some embodiments, the buried layer 210 is formed within the well recess 208. In some embodiments, the buried layer 210 is an epitaxial layer. In some embodiments, the buried layer 210 includes silicon (Si). In some embodiments, the buried layer 210 includes an addition species. In some embodiments, the addition species includes at least one of carbon (C), boron (B), phosphorous (P), germanium (Ge) or tin (Sn). In some embodiments, the buried layer 210 includes at least one of silicon carbide (SiC), silicon phosphorus carbide (SiPC) silicon phosphorus (SiP), silicon germanium (SiGe), silicon-boron (SiB), or silicon-tin (SiSn). In some embodiments, the additional species is present in the buried layer 210 at a concentration of less than four percent. In some embodiments, the additional species is present in the buried layer 210 at a concentration of at least four percent. In some embodiments, the buried layer 210 includes less than four percent carbon. In some embodiments, the buried layer 210 includes at least 4 percent carbon. In some embodiments, the buried layer 210 has a first thickness 212. In some embodiments, the first thickness 212 is between about 5 to about 50 nanometers (nm).

In some embodiments, the buried layer 210 is formed by a third process 330. In some embodiments, the third process 330 includes at least one of an epitaxy process, an implant process or a bonding process. In some embodiments, the buried 210 is grown by at least one of solid-phase epitaxy (SPE) or vapor-phase epitaxy. In some embodiments, silicon is grown by an epitaxy process. In some embodiments, the addition species is added to the silicon during the epitaxy process via in-situ doping.

Figure 6:
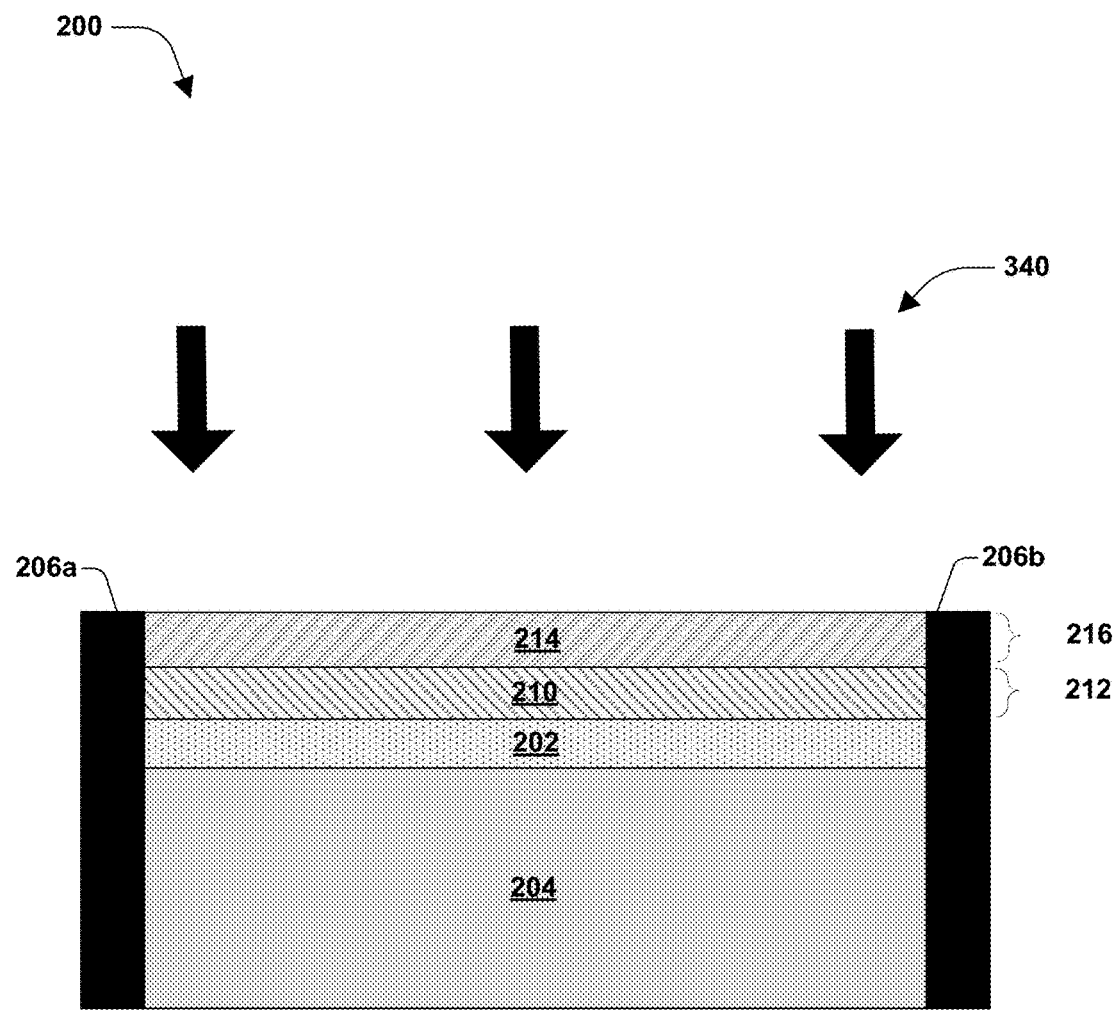
FIG. 6 is a cross-sectional view of a semiconductor arrangement during fabrication, according to some embodiments.

At 110, a dielectric layer 214 is formed over the buried layer 210, as illustrated in FIG. 6. In some embodiments, the dielectric layer 214 is an epitaxial layer. In some embodiments, the dielectric layer 214 includes silicon. In some embodiments, the silicon is pure or substantially pure silicon. In some embodiments, the dielectric layer 214 has a second thickness 216. In some embodiments, the second thickness 216 is about 3 to about 100 nm.

In some embodiments, the dielectric layer 214 is formed by a fourth process 340. In some embodiments, the fourth process 340 includes at least one of an atomic layer deposition (ALD), chemical vapor deposition (CVD), physical vapor deposition (PVD), a thermal oxidation process or an epitaxy process. In some embodiments, the dielectric layer 214 is grown by at least one of solid-phase epitaxy (SPE) or vapor-phase epitaxy.

Figure 7:
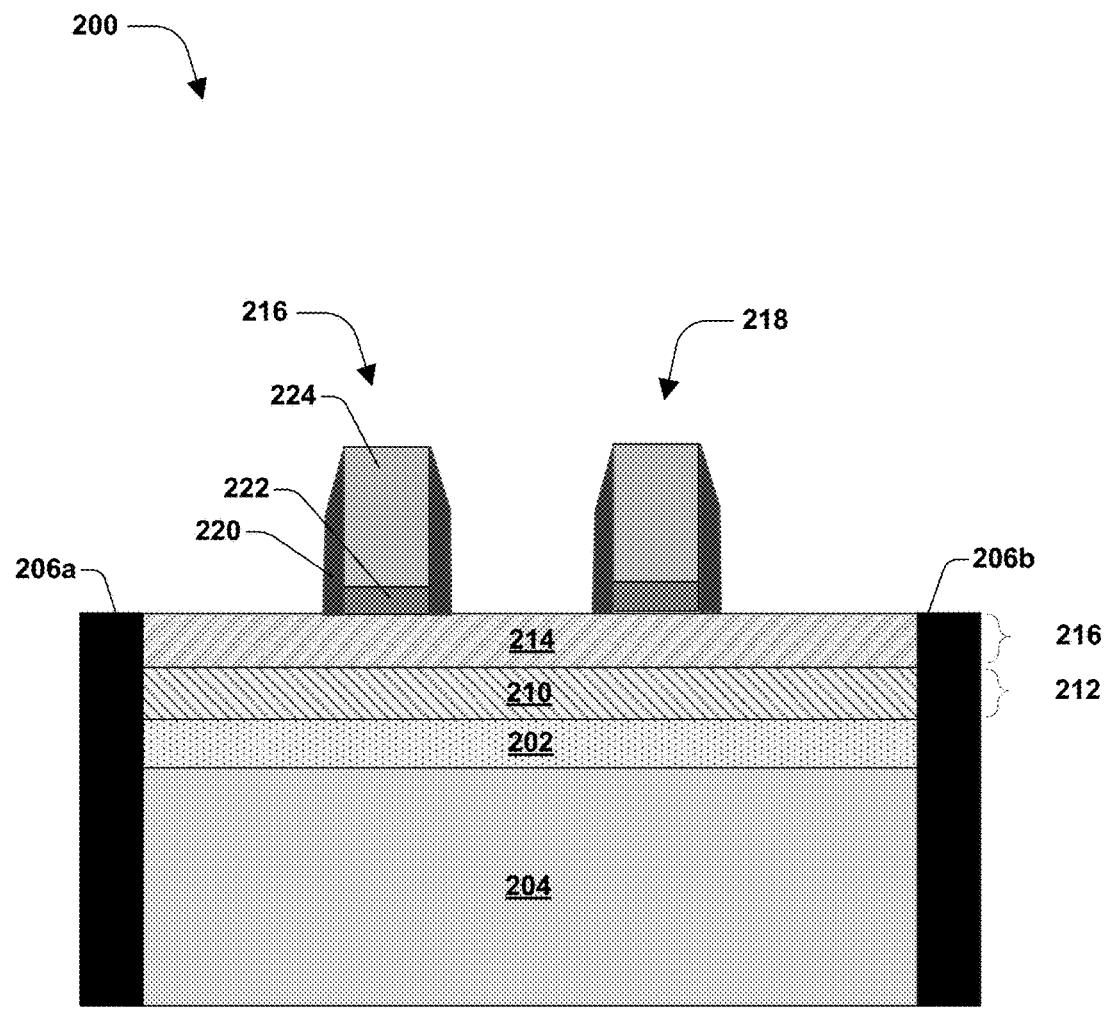
FIG. 7 is a cross-sectional view of a semiconductor arrangement during fabrication, according to some embodiments.

At 112, a first gate stack 216 is formed, as illustrated in FIG. 7. In some embodiments, a second gate stack 224 is formed. In some embodiments, at least one of the first gate stack 216 or the second gate stack 218 is over the dielectric layer 214. In some embodiments, at least one of the first gate stack 216 or the second gate stack 218 includes at least one of a sidewall spacer 220, a gate dielectric layer 222 or a gate electrode layer 224. In some embodiments, the gate dielectric layer 222 includes at least one of silicon oxide, silicon nitride, silicon oxynitride, or a high-k dielectric material. In some embodiments, the gate dielectric layer 222 has a thickness of about 1 to about 30 nm. In some embodiments, the gate dielectric layer 222 is formed using at least one of an ALD, CVD, PVD or thermal oxidation process. In some embodiments, the sidewall spacer 220 includes at least one of silicon nitride, silicon oxide, silicon carbide or silicon oxynitride. In some embodiments, the sidewall spacer 220 is about 5 to about 20 nm wide.

In some embodiments, the gate electrode layer 224 includes at least one of a single layer or a multilayer structure. In some embodiments, the gate electrode layer 224 includes a poly. In some embodiments, the poly is a polysilicon. In some embodiments, the gate electrode layer 224 includes a doped poly-silicon with at least one of uniform or non-uniform doping. In some embodiments, the gate electrode layer 224 includes a metal. In some embodiments, the gate electrode layer 224 includes at least one of Al, Cu, W, Ti, Ta, TiN, TiAl, TiAlN, TaN, NiSi or CoSi. In some embodiments, the gate electrode layer 224 includes a conductive material with a work function. In some embodiments, the gate electrode layer 224 has a thickness of about 10 nm to about 100 nm. In some embodiments, the gate electrode layer 224 is formed using at least one of an ALD, CVD, PVD or plating process.

Figure 8A:
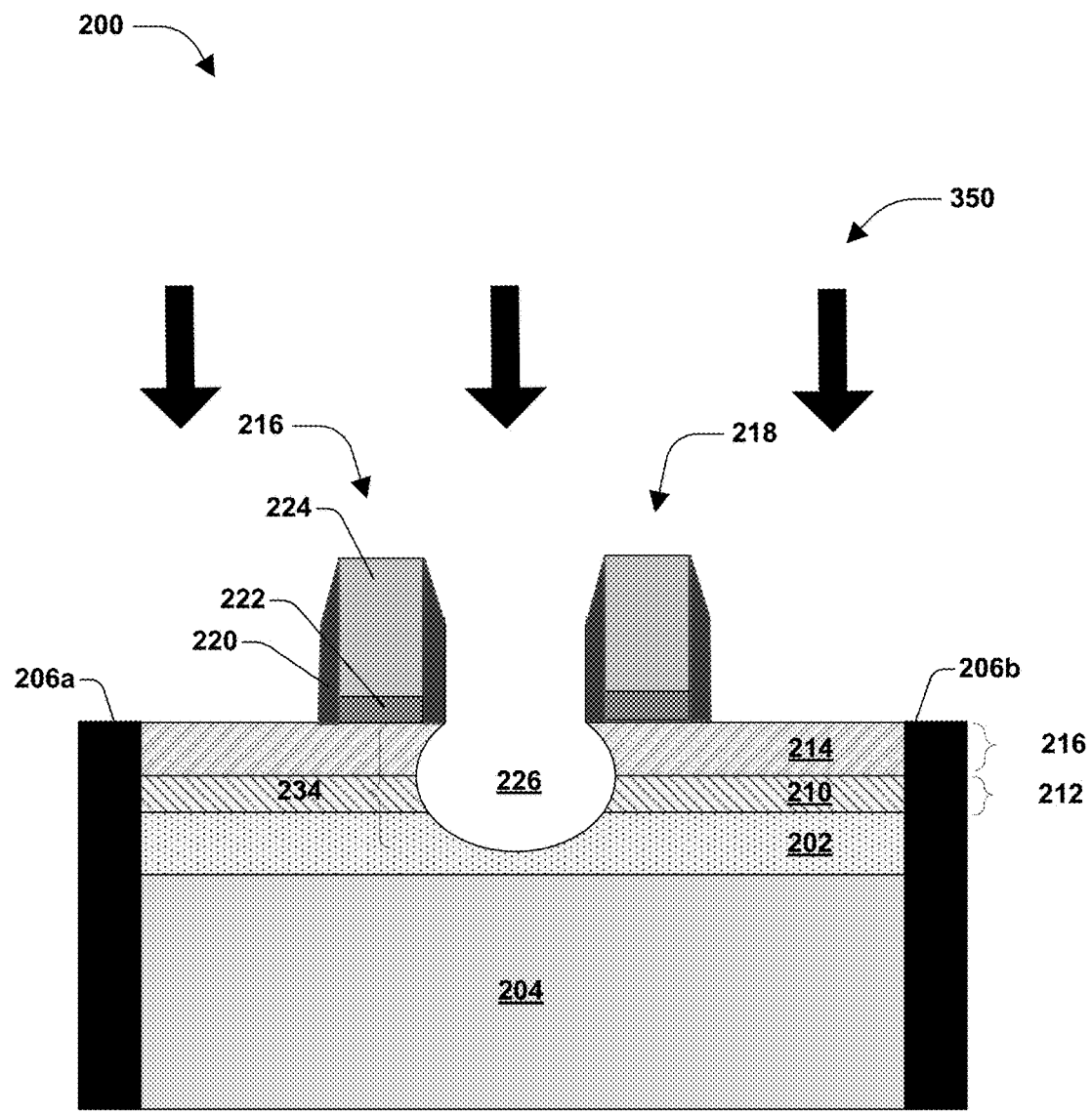
FIGS. 8a-8e provide a cross-sectional view of a semiconductor arrangement during fabrication, according to some embodiments.

At 114, a source/drain (S/D) recess 226 is formed, as illustrated in FIG. 8a. In some embodiments, the S/D recess 226 is formed in at least one of the dielectric layer 214, the buried layer 210 or the well 202. In some embodiments, the S/D recess 226 is proximate at least one of the first gate stack 216 or the second gate stack 218. In some embodiments, the S/D recess 226 has a first depth 234. In some embodiments, the first depth 234 is about 0.5 to about 150 nm.

In some embodiments, the S/D recess 226 is formed by a fifth process 350. In some embodiments, the fifth process 350 includes an etching process. In some embodiments, the fifth process 350 includes at least one of a wet etching process or a dry etching process. In some embodiments, at least one of the wet etching process or the dry etching process includes the use of at least one of hydrogen fluoride (HF), sodium hydroxide (NaOH), chlorine (Cl), tetrafluoromethan ($CF_4$), sulfur hexafluoride ($SF_6$), or nitrogen trifluoride ($NF_3$). In some embodiments, the dry etching process includes the use of Cl. In some embodiments, the wet etching process includes the use of NaOH.

In some embodiments, the S/D recess 226 includes at least one of a first recess tip proximity region 228 or a second recess tip proximity region 230, as illustrated in FIG. 8b-FIG. 8e. In some embodiments, at least one of the first recess tip proximity region 228 or the second recess tip proximity region 230 is formed as a function of the buried layer 210. In some embodiments, the composition of the buried layer 210 affects the etching process.

Figure 8B:
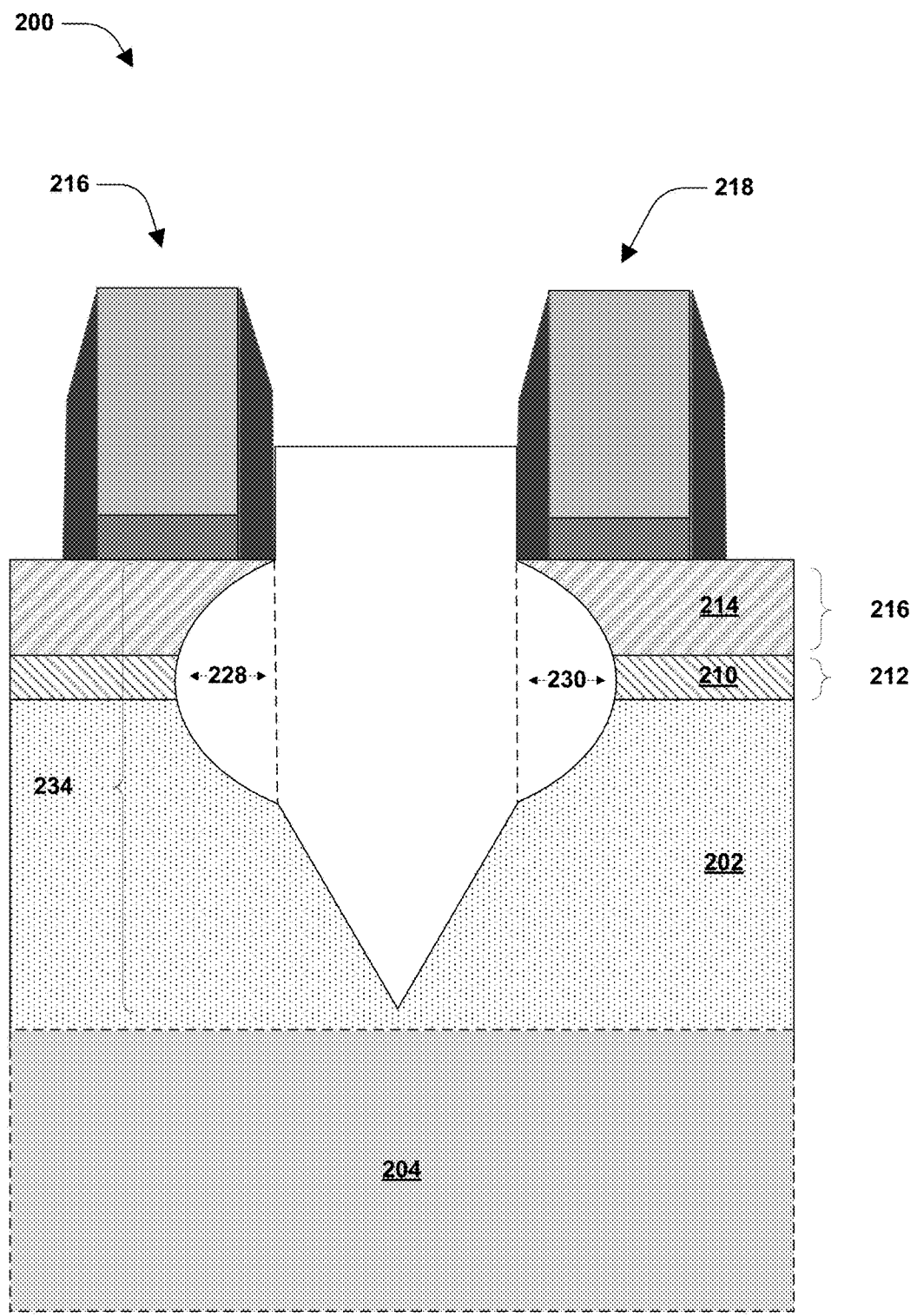
Figure 8C:
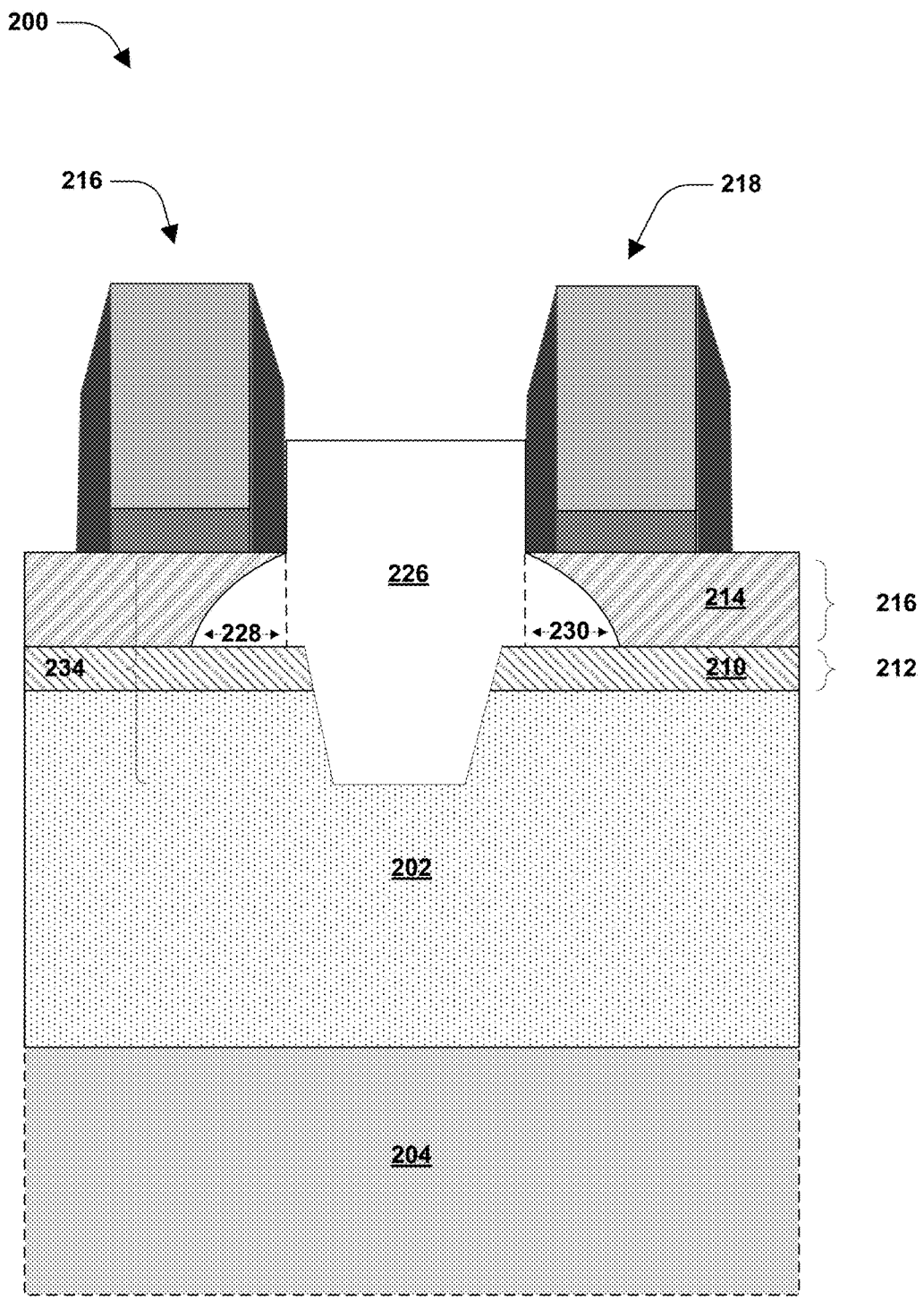
Figure 8D:
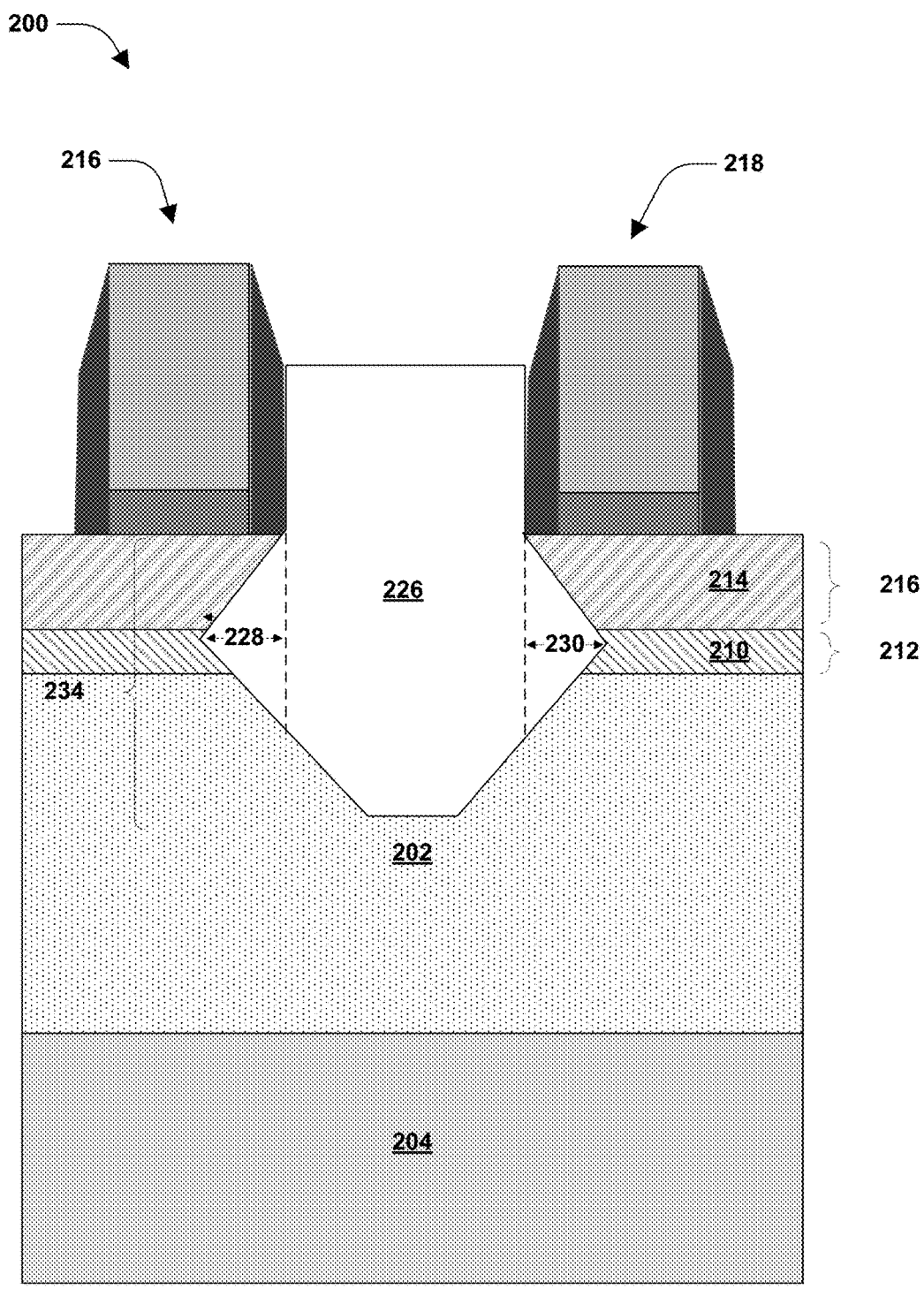
Figure 8E:
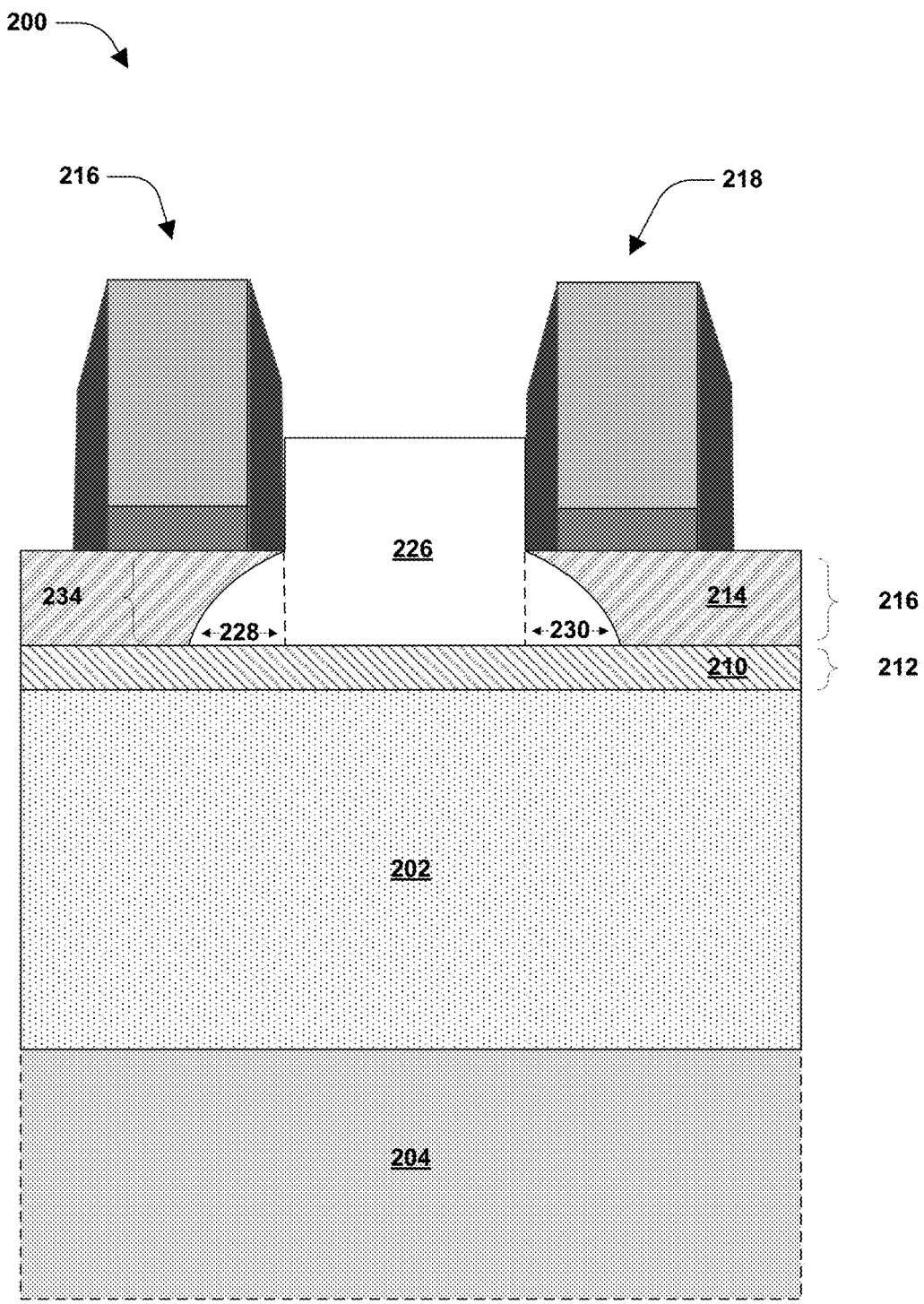

In some embodiments, the concentration of the addition species in the buried layer 210 is high and the buried layer 210 acts as an etch stop layer, as illustrated in FIG. 8e. In some embodiments, the concentration of the addition species is low and the etching process etches through the buried layer 210, as illustrated in FIG. 8a-FIG. 8d. In some embodiments, when the addition species concentration is at least four percent, the buried layer 210 function as an etch stop layer. In some embodiments, when the addition species concentration is less than four percent, the buried layer 210 is etchable.

In some embodiments, a wet etching process is performed with respect to the dielectric layer 214 and a dry etching process is performed with respect to the buried layer 210. In some embodiments, a first wet etching process is used to etch down to the buried layer 210, as illustrated in FIG. 8e. In some embodiments, the first wet etching process is used to shape at least one of the first recess tip proximity region 228 or the second recess tip proximity region 230. In some embodiments, a dry etching process is used to etch through the buried layer 210, as illustrated in FIG. 8a-FIG. 8d. In some embodiments, a second wet etching process is performed after the buried layer 210 has been etched. In some embodiments, the second wet etching process is used to further shape at least one of the first recess tip proximity region 228 or the second recess tip proximity region 230.

In some embodiments, at least one of the first recess tip proximity region 228 or the second recess tip proximity region 230 is semi-circularly shaped, as illustrated in FIG. 8b. In some embodiments, at least one of the first recess tip proximity region 228 or the second recess tip proximity region 230 is arch shaped, as illustrated in FIG. 8c and FIG. 8e. In some embodiments, at least one of the first recess tip proximity region 228 or the second recess tip proximity region 230 is triangularly shaped, as illustrated in FIG. 8d.

In some embodiments, at least one of the first recess tip proximity region 228 or the second recess tip proximity region 230 extends under at least one of the first gate stack 216 or the second gate stack 218. In some embodiments, the first recess tip proximity region 228 extends under the first gate stack 216 and the second recess tip proximity region 230 extends under the second gate stack 218. In some embodiments, at least one of the first recess tip proximity region 228 or the second recess tip proximity region 230 extends under at least one of the first gate stack 216 or the second gate stack 218 between about 0.1 to about 50 nm.

Figure 9:
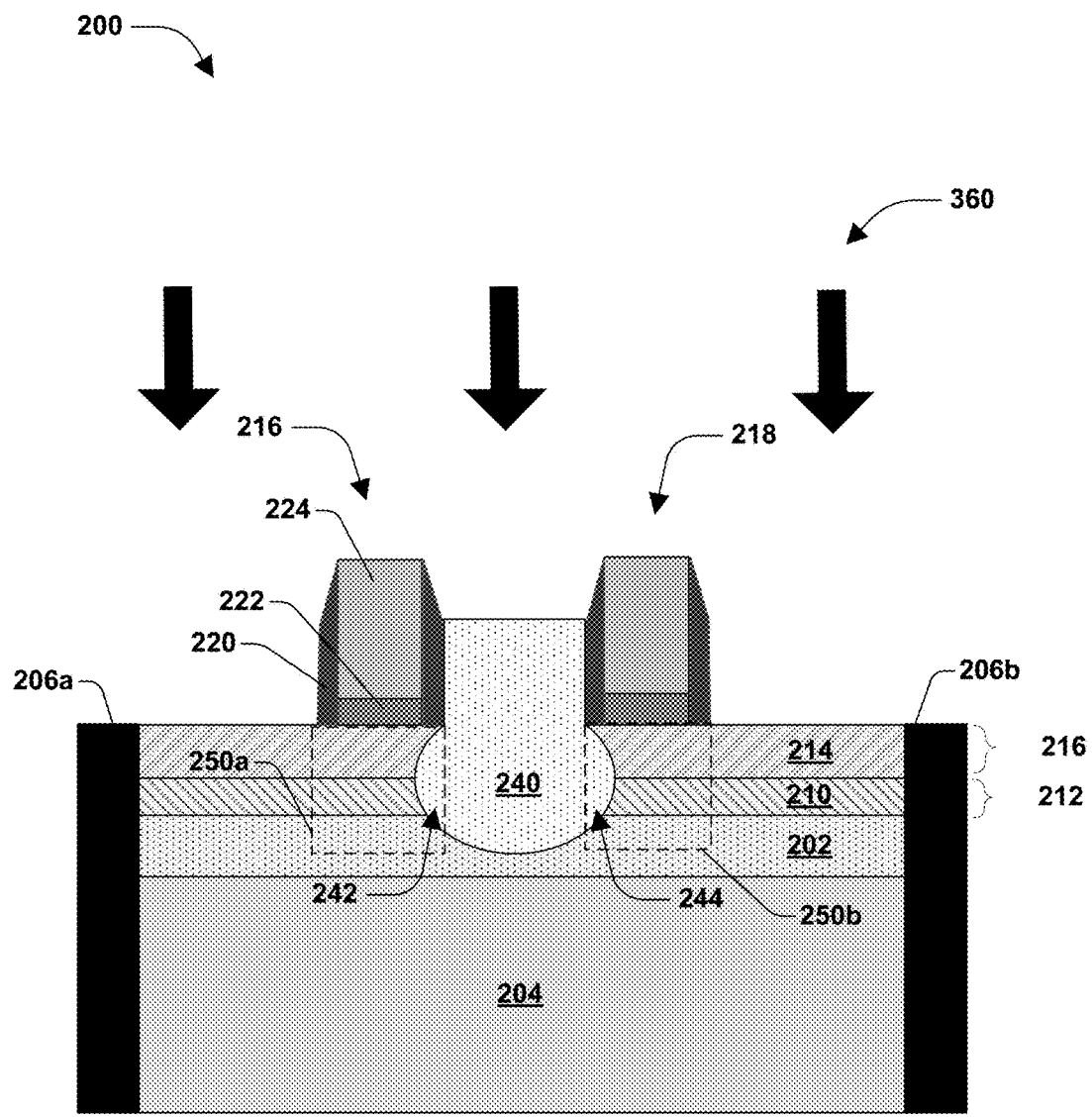
FIG. 9 is a cross-sectional view of a semiconductor arrangement during fabrication, according to some embodiments.

At 116, a S/D region 240 is formed, as illustrated in FIG. 9. In some embodiments, the S/D region 240 is formed in the S/D recess 226. In some embodiments, the S/D region 240 is formed in the S/D recess 226 such that the S/D region 240 has at least one of a first tip proximity region 242 or a second tip proximity region 244. In some embodiments, at least one of the first tip proximity region 242 or the second tip proximity region 244 extends under at least one of the first gate stack 216 of the second gate stack 218. In some embodiments, at least one of the first tip proximity region 242 or the second tip proximity region 244 has at least one of substantially the same dimensions or substantially the same shape as at least one of the first recess tip proximity region 228 or the second recess tip proximity region 230.

In some embodiments, the shape of the S/D region 240 alters at least one of a stress or a strain applied to a channel region, such as channel regions 250a-250b. In some embodiments, a higher compressive strain on the channel regions 250a-250b results in a higher hole mobility. In some embodiments, higher hold mobility enhances electron mobility and alters the performance of the semiconductor arrangement 200.

In some embodiments, the S/D region 240 is formed by a sixth process 360. In some embodiments, the sixth process 360 includes at least one of an epitaxy process, an implant process or a bonding process. In some embodiments, the S/D region 240 is epitaxially grown. In some embodiments, silicon is grown in the S/D region 240. In some embodiments, the silicon grown in the S/D region 240 is doped with germanium.

In some embodiments, the method 100 alters at least one of the stress or strain in the channel region without the use of a thermal annealing process or a dopant drive-in process.

In some embodiments, the semiconductor arrangement 200 includes other layers or features not specifically illustrated including at least one of an interlayer dielectric (ILD) layer, a contact, an interconnect or other suitable features. In some embodiments, other back end of line (BEOL) processes are preformed on the semiconductor arrangement 200.

According to some aspects of the instant disclosure, a semiconductor arrangement is provided. The semiconductor arrangement comprises a buried layer over a well, a dielectric layer over the buried layer, a first gate stack over the dielectric layer and a S/D region disposed proximate the first gate stack. The S/D region having a first tip proximity region. The first tip proximity region extending under the first gate stack.

According to some aspects of the instant disclosure, a method of forming a semiconductor arrangement is provided. The method comprising forming a buried layer over a well, forming a dielectric layer over the buried layer, forming a first gate stack over the dielectric layer, forming a S/D recess in at least one of the dielectric layer, the buried layer or the well, wherein the S/D recess is proximate the first gate stack and has a first recess tip proximity region that extends under the first gate stack as a function of the buried layer, and forming a S/D region in the S/D recess such that the S/D region has a first tip proximity region that extends under the first gate stack.

According to some aspects of the instant disclosure, a method of forming a semiconductor arrangement is provided. The method comprising forming a first isolation structure proximate a well, forming a well recess in the well, wherein the well recess is proximate the first isolation structure, forming a buried layer over the well within the well recess, forming a dielectric layer over the buried layer, forming a first gate stack over the dielectric layer, forming a S/D recess in at least one of the dielectric layer, the buried layer or the well, wherein the S/D recess is proximate the first gate stack and has a first recess tip proximity region that extends under the first gate stack as a function of the buried layer, and forming a S/D region in the S/D recess such that the S/D region has a first tip proximity region that extends under the first gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
   a buried layer comprising a silicon and carbon composition over a well;
   a silicon layer over the buried layer;
   a first gate stack over the silicon layer; and
   a source/drain (S/D) region disposed proximate the first gate stack, the S/D region extending through the silicon layer and the buried layer and extending into the well, the S/D region having a first tip proximity region, the first tip proximity region extending under the first gate stack.

2. The semiconductor arrangement of claim 1, wherein the first tip proximity region extends under the first gate stack between about 0.1 to about 50 nm.

3. The semiconductor arrangement of claim 1, wherein the first tip proximity region is arch, triangularly, or semi-circularly shaped.

4. The semiconductor arrangement of claim 1, the buried layer comprising:
   at least one of phosphorous or boron.

5. The semiconductor arrangement of claim 4, wherein the buried layer has a concentration of at least four percent carbon.

6. The semiconductor arrangement of claim 4, wherein the buried layer has a concentration of less than four percent carbon.

7. The semiconductor arrangement of claim 1, wherein the buried layer is between about 0.5 to about 50 nm thick.

8. The semiconductor arrangement of claim 1, wherein the silicon layer is between about 3 to about 100 nm thick.

9. The semiconductor arrangement of claim 1, comprising:
   a second gate stack over the silicon layer and spaced apart from the first gate stack; and
   the S/D region having a second tip proximity region extending under the second gate stack.

10. A method of forming a semiconductor arrangement comprising:
    forming a buried layer comprising a silicon and carbon composition over a well;
    forming a silicon layer over the buried layer;
    forming a first gate stack over the silicon layer;
    forming a source/drain (S/D) recess through the silicon layer, the buried layer and a portion of the well, the S/D recess proximate the first gate stack and having a first recess tip proximity region that extends under the first gate stack as a function of the buried layer; and
    forming a S/D region in the S/D recess such that the S/D region has a first tip proximity region that extends under the first gate stack.

11. The method of claim 10, the forming a buried layer comprising:
    performing at least one of an epitaxy process, an implant process or a bonding process.

12. The method of claim 10, comprising:
    etching the well to define a well recess, wherein the forming a buried layer comprises forming the buried layer in the well recess.

13. The method of claim 10, the forming a S/D recess comprising:
    performing at least one of a dry etching process or a wet etching process.

14. The method of claim 10, the forming a S/D recess comprising:

performing a wet etching process with respect to the silicon layer and a dry etching process with respect to the buried layer.

15. The method of claim 14, wherein at least one of the dry etching process or the wet etching process comprises etching with at least one of chlorine or ammonium hydroxide.

16. A method of forming a semiconductor arrangement comprising:
    forming a first isolation structure proximate a well;
    forming a well recess in the well, the well recess proximate the first isolation structure;
    forming a buried layer comprising a silicon and carbon composition over the well within the well recess;
    forming a silicon layer over the buried layer;
    forming a first gate stack over the silicon layer;
    forming a source/drain (S/D) recess, comprising:
    performing a wet etch with respect to the silicon layer to etch through the silicon layer; and
    performing a dry etch with respect to the buried layer to etch at least into the buried layer, the S/D recess proximate the first gate stack and having a first recess tip proximity region that extends under the first gate stack as a function of the buried layer; and
    forming a S/D region in the S/D recess such that the S/D region has a first tip proximity region that extends under the first gate stack.

17. The method of claim 16, the forming a buried layer comprising:
    performing at least one of an epitaxy process, an implant process or a bonding process.

18. The method of claim 16, the forming a buried layer comprising:
    exposing silicon to at least one phosphorous or boron.

19. The method of claim 16, wherein the dry etch etches through the buried layer and the forming a S/D recess comprising:
    performing a second wet etching process to etch at least into the well.

20. The semiconductor arrangement of claim 1, the S/D region laterally co-planar with the well.

* * * * *